(12) United States Patent
Lise et al.

(10) Patent No.: US 11,965,928 B1
(45) Date of Patent: Apr. 23, 2024

(54) HYBRID CIRCUIT THERMAL TEST VEHICLES, SYSTEMS, AND METHODS

(71) Applicant: Juniper Networks, Inc., Sunnyvale, CA (US)

(72) Inventors: Marshall J. Lise, Sunnyvale, CA (US); Travis S. Mikjaniec, Sunnyvale, CA (US); Sean Kim, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 312 days.

(21) Appl. No.: 17/410,101

(22) Filed: Aug. 24, 2021

(51) Int. Cl.
*G01R 31/28* (2006.01)
*H05B 3/26* (2006.01)

(52) U.S. Cl.
CPC ......... *G01R 31/2875* (2013.01); *H05B 3/265* (2013.01); *H05B 2203/004* (2013.01); *H05B 2203/013* (2013.01); *H05B 2203/016* (2013.01)

(58) Field of Classification Search
None
See application file for complete search history.

(56) References Cited

U.S. PATENT DOCUMENTS

2023/0084616 A1\* 3/2023 Jingu ...................... H01L 22/00
324/750.03

\* cited by examiner

*Primary Examiner* — Vincent Q Nguyen
(74) *Attorney, Agent, or Firm* — Greenberg Traurig, LLP (57) ABSTRACT

A disclosed Thermal Test Vehicle (TTV) for simulating the thermal characteristics of a certain integrated circuit may include (1) a substrate that serves as both (A) an electrical insulator that resists electrical energy and (B) a thermal conductor that conducts thermal energy and (2) one or more resistive elements coupled to the substrate, wherein the resistive elements extend across a majority of at least one dimension of the substrate. Various other apparatuses, systems, and methods are also disclosed.

20 Claims, 8 Drawing Sheets

HYBRID CIRCUIT THERMAL TEST VEHICLES, SYSTEMS, AND METHODS

BACKGROUND

Cooling and/or heat-mitigation solutions are often a critical component of electronic and mechanical devices. For example, a telecommunications device may include an integrated circuit that generates heat during operation, thereby causing the operating temperature of the integrated circuit to rise. If the operating temperature rises above a certain level, the integrated circuit may overheat, malfunction, or even break. To prevent such issues, many devices may be equipped with cooling and/or heat-mitigation solutions (e.g., heatsinks) designed to transfer and/or dissipate heat. For example, heatsinks may include thermally conductive material that transfers heat away from other devices, thereby cooling those devices and/or enabling them to achieve higher and/or optimal performance.

The operating temperature of a device often correlates to the amount of power dissipated by that device. As technological advancements increase the amount of power certain devices (such as application-specific integrated circuits and/or high-bandwidth memory devices) are able to dissipate, such devices may need and/or call for more efficient and/or effective heatsinks. To ensure that the cooling and/or heat-mitigation solutions implemented in certain computing devices are sufficient, computing equipment manufacturers and/or vendors may perform thermal testing with Thermal Test Vehicles (TTVs). For example, TTVs may be used by manufacturers and/or vendors to simulate the thermal characteristics and/or output of certain integrated circuits, such as Application-Specific Integrated Circuits (ASICs). In this example, the manufacturers and/or vendors may determine whether their designs for cooling and/or heat-mitigation solutions will satisfy and/or support the cooling and/or heat-mitigation needs of the integrated circuits during operation.

Unfortunately, some TTVs may be unable to properly simulate the thermal characteristics and/or output of certain integrated circuits whose cooling and/or heat-mitigation solutions are in need of testing. For example, some TTVs may be unable to simulate and/or replicate the thermal characteristics of an ASIC, with a specific form factor, that consumes 500 watts of power during operation. The instant disclosure, therefore, identifies and addresses a need for additional and improved apparatuses, systems, and methods for simulating and/or replicating the thermal characteristics of integrated circuits whose cooling and/or heat-mitigation solutions are in need of testing.

SUMMARY

As will be described in greater detail below, the instant disclosure generally relates to apparatuses, systems, and methods for simulating and/or replicating the thermal characteristics of integrated circuits whose cooling and/or heat-mitigation solutions are in need of testing. In one example, a TTV for accomplishing such a task may include (1) a substrate that serves as both (A) an electrical insulator that resists electrical energy and (B) a thermal conductor that conducts thermal energy and (2) one or more resistive elements coupled to the substrate, wherein the resistive elements extend across a majority of at least one dimension of the substrate.

Similarly, a system for accomplishing such a task may include (1) a TTV for accomplishing such a task may include (A) a substrate that serves as both (I) an electrical insulator that resists electrical energy and (II) a thermal conductor that conducts thermal energy and (B) one or more resistive elements coupled to the substrate, wherein the resistive elements extend across a majority of at least one dimension of the substrate and (2) at least one electrical component electrically coupled to the resistive elements of the TTV, wherein the electrical component sources electric current to the resistive elements to produce heat.

A corresponding method may include (1) manufacturing a substrate that serves as both (A) an electrical insulator that resists electrical energy and (B) a thermal conductor that conducts thermal energy, (2) applying resistive material to the substrate such that the resistive material extends across a majority of at least one dimension of the substrate, and (3) firing the resistive material applied to the substrate to form a TV that includes one or more resistive elements that extend across the majority of the dimension of the substrate.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various hybrid circuit thermal TTVs, systems, and methods for simulating and/or replicating the thermal characteristics of integrated circuits. The term "hybrid circuit TTV," as used herein, may refer to the hybrid nature and/or purposes of certain resistive elements fired and/or baked onto a substrate this is thermally conductive but electrically insulative. For example, a TTV may include and/or represent a hybrid circuit that provides heat generation via resistive elements and thermal conductivity via a substrate on which the resistive elements are fired and/or baked.

As will be explained in greater detail below, embodiments of the instant disclosure may facilitate and/or support the simulation and/or replication of the thermal characteristics of integrated circuits whose cooling and/or heat-mitigation solutions are in need of testing and/or analysis. By doing so, these embodiments may enable computing equipment manufacturers and/or vendors to test and/or analyze the effectiveness or efficiency of the cooling and/or heat-mitigation solutions implemented in and/or proposed for certain computing devices.

As a result, these computing equipment manufacturers and/or vendors may be able to ensure whether or not the cooling and/or heat-mitigation solutions implemented in and/or proposed for such devices are sufficient. In other words, these computing equipment manufacturers and/or vendors may determine whether or not their designs for cooling and/or heat-mitigation solutions will satisfy and/or support the cooling and/or heat-mitigation needs of the integrated circuits during operation.

The following will provide, with reference to FIGS. 1-7, detailed descriptions of exemplary components, apparatuses, systems, configurations, and/or implementations for simulating and/or replicating the thermal characteristics of integrated circuits. In addition, the discussion corresponding to FIG. 8 will provide a detailed description of an exemplary method for assembling and/or manufacturing hybrid circuit TTVs for simulating and/or replicating the thermal characteristics of integrated circuits.

Figure 1:
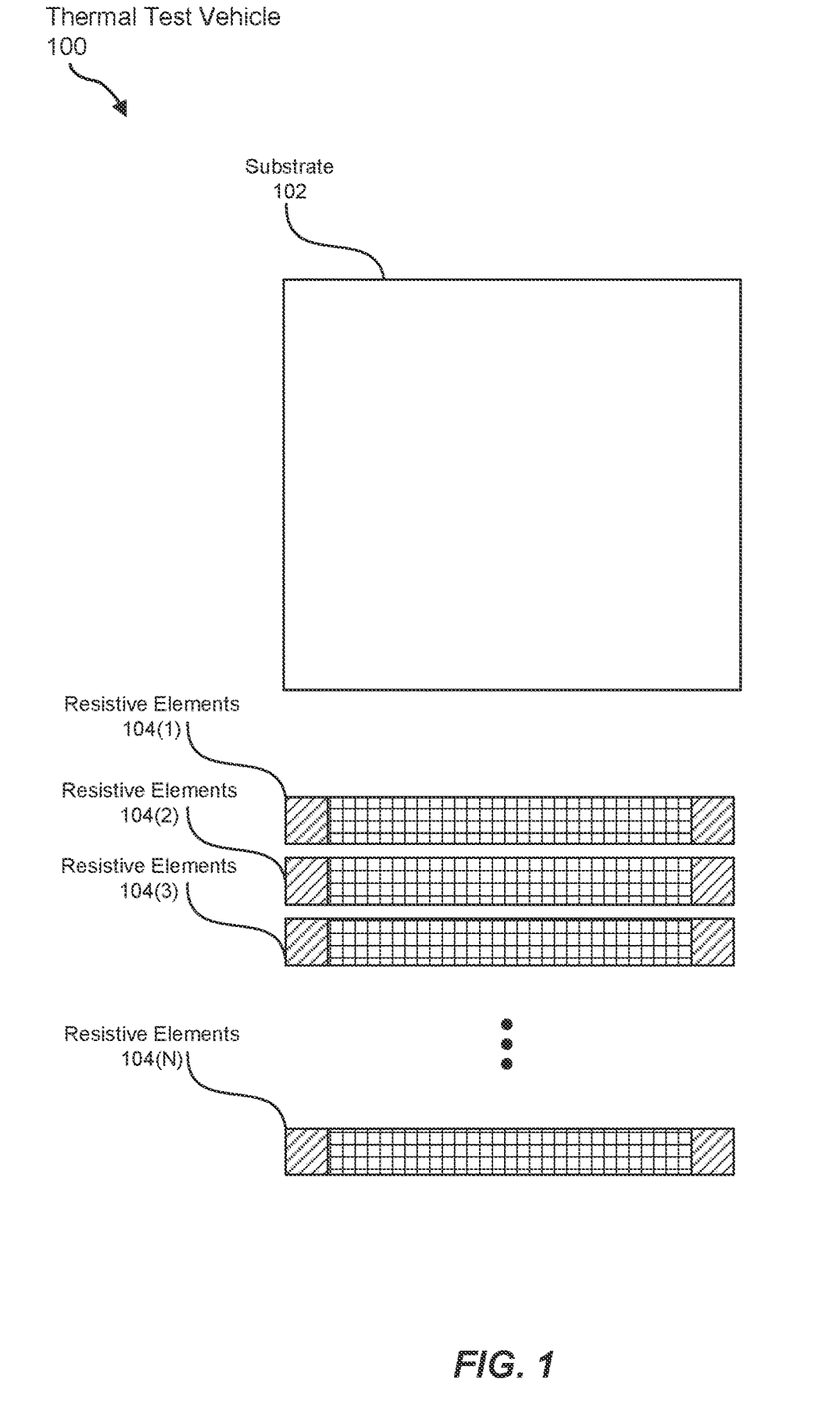
FIG. 1 is an illustration of an exemplary TTV for simulating and/or replicating the thermal characteristics of integrated circuits in accordance with one or more embodiments of this disclosure.

FIG. 1 illustrates an exemplary TTV 100 for simulating and/or replicating the thermal characteristics of integrated circuits. As illustrated in FIG. 1, exemplary TTV 100 may include and/or represent a substrate 102 and/or one or more resistive elements 104(1)-(N). In some examples, substrate 102 may serve and/or function as both an electrical insulator that resists electrical energy (e.g., the flow of electric current) and a thermal conductor that conducts thermal energy. In these examples, resistive elements 104(1)-(N) may be coupled and/or applied to substrate 102. In one example, resistive elements 104(1)-(N) may extend and/or run across a majority of at least one dimension of substrate 102.

TTV 100 may be sized in a particular way to fit within and/or interface with a cooling and/or heat-mitigation solution. TTV 100 may include and/or contain any of a variety of materials.

In some examples, substrate 102 may include and/or represent any type or form of material that exhibits qualities and/or characteristics of both electrical insulation and thermal conductivity. In such examples, substrate 102 may include and/or represent a ceramic base on which the resistive paste is deposited, fired, and/or baked. For example, substrate 102 may include and/or represent a base of alumina ceramics (e.g., aluminum nitride), alumina (e.g., aluminum oxide), and/or boron nitride. In one example, the resistive paste may be applied and/or deposited uniformly on and/or atop the ceramic base such that the height of the resistive paste is uniform and/or consistent across all of resistive elements 104(1)-(N). In this example, the resistive paste may be fired and/or baked to substrate 102 in an oven and/or furnace whose temperatures reach a certain threshold (e.g., 300 degrees Celsius or higher).

Substrate 102 may be of various shapes and/or dimensions. In some examples, substrate 102 may form a square, a rectangle, and/or a cube. Additional examples of shapes formed by substrate 102 include, without limitation, ovals, circles, variations or combinations of one or more of the same, and/or any other suitable shapes. Substrate 102 may be sized in a particular way to simulate and/or replicate the form, shape, and/or thermal characteristics of an integrated circuit (such as an ASIC).

In some examples, resistive elements 104(1)-(N) may each include and/or represent any type or form of component and/or feature that converts power (e.g., electric current and/or voltage) into heat. In such examples, resistive elements 104(1)-(N) may serve and/or function as a set of heaters that generate and/or transfer heat to substrate 102 under or during thermal testing. In one example, resistive elements 104(1)-(N) may each include and/or represent a thick film resistor and/or element applied, fired, and/or baked directly onto substrate 102. For example, resistive elements 104(1), 104(2), 104(3), and/or 104(N) may include and/or represent resistive paste that is deposited, fired, and/or baked on one surface of substrate 102. In this example, the resistive paste may include and/or represent a mixture and/or compound of metal oxides (e.g., ruthenium, iridium, and rhenium oxides), conductive materials, binders, carriers, and/or glass.

Resistive elements 104(1)-(N) may be of various shapes and/or dimensions. In some examples, resistive elements 104(1)-(N) may form a square, a rectangle, and/or a circle. Additional examples of shapes formed by resistive elements 104(1)-(N) include, without limitation, triangles, pentagons, hexagons, octagons, ovals, diamonds, parallelograms, combinations or variations of one or more of the same, and/or any other suitable shapes. Resistive elements 104(1)-(N) may be individually and/or collectively sized in a particular way to simulate and/or replicate the form, shape, and/or thermal characteristics of an integrated circuit (such as an ASIC). Such an integrated circuit may be planned for inclusion and/or implementation in an upcoming computing device that has yet to be released.

In some examples, resistive elements 104(1)-(N) may be formed, arranged, and/or configured to optimize and/or maximize the amount of surface area on substrate 102 that receives, absorbs, and/or conducts heat. In such examples, substrate 102 may serve and/or function as a heat spreader, which subsequently transfers the heat to an interfacing heatsink. In one example, resistive elements 104(1)-(N) may collectively cover nearly the entire surface of one side of substrate 102. For example, resistive elements 104(1)-(N)

may collectively cover sixty percent, seventy percent, eighty percent, ninety percent, or one hundred percent of one side of substrate 102.

Additionally or alternatively, resistive elements 104(1)-(N) may each extend and/or run across nearly all of one dimension (e.g., the x-dimension and/or y-dimension) on the surface of substrate 102. For example, resistive elements 104(1)-(N) may each extend and/or run across sixty percent, seventy percent, eighty percent, ninety percent, or one hundred percent of the x-dimension and/or y-dimension of substrate 102.

In some examples, resistive elements 104(1)-(N) may be formed, arranged, and/or configured in a certain pattern, shape, and/or design to simulate and/or replicate the thermal characteristics of integrated circuits. In one example, resistive elements 104(1)-(N) may be disposed and/or arranged atop substrate 102 in a continuous square-wave pattern and/or shape. In another example, resistive elements 104(1)-(N) may be disposed and/or arranged atop substrate 102 in a linear pattern and/or configuration.

In some examples, resistive elements 104(1)-(N) may include and/or represent a plurality of conductive terminals configured to be soldered to at least one electrical component (e.g., a circuit board, power source, etc.) that sources electric current to the resistive elements to produce heat. In one example, the conductive terminals may be positioned and/or placed proximate to the corners of substrate 102. In this example, the conductive terminals may be conductively coupled to a circuit board that supplies and/or delivers electric current and/or power to resistive elements 104(1)-(N). The electric current may pass through resistive elements 104(1)-(N), thereby producing heat that transfers to substrate 102.

Figure 2:
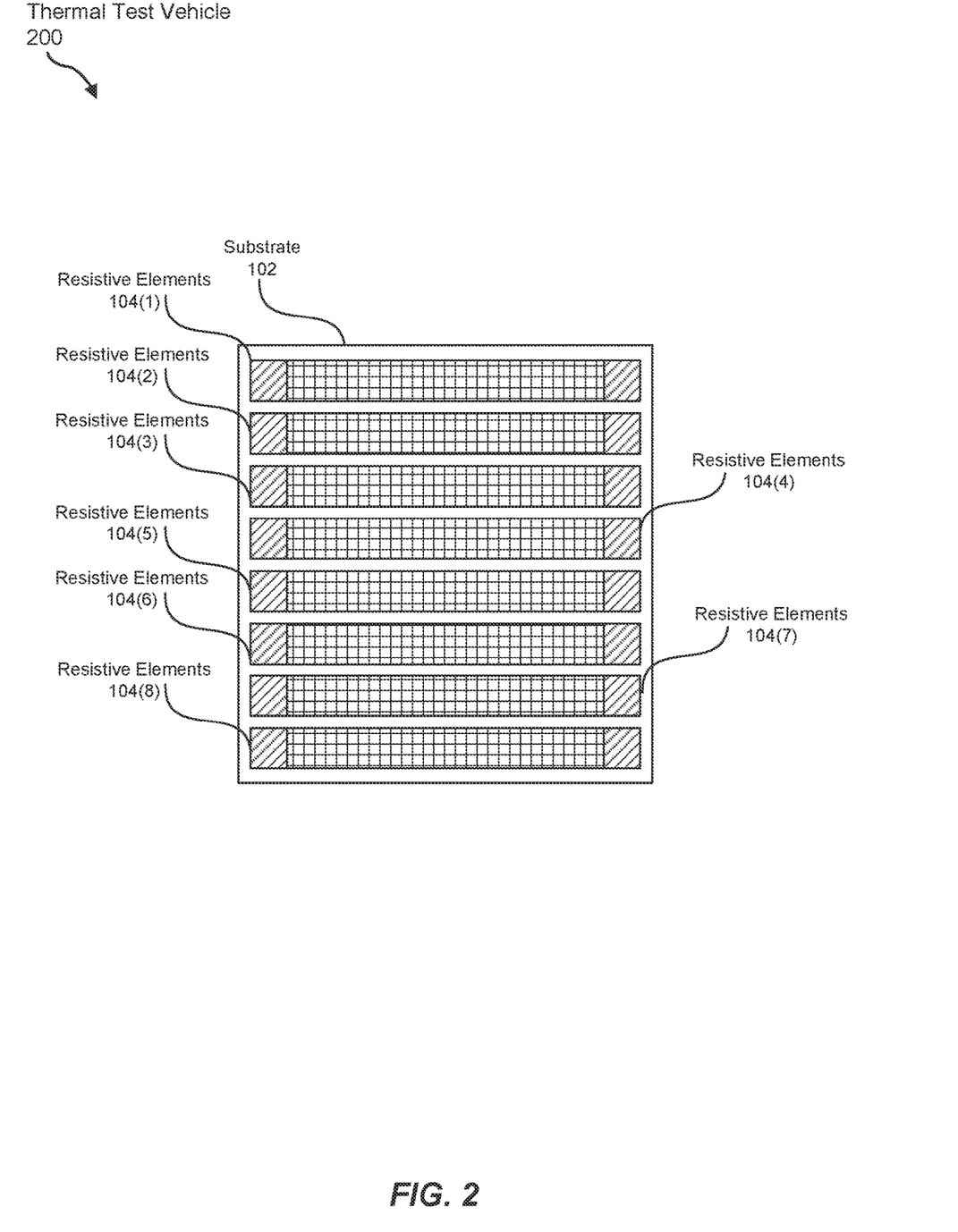
FIG. 2 is an illustration of an additional exemplary TTV for simulating and/or replicating the thermal characteristics of integrated circuits in accordance with one or more embodiments of this disclosure.

FIG. 2 illustrates an exemplary TTV 200 for simulating and/or replicating the thermal characteristics of integrated circuits. As illustrated in FIG. 2, exemplary TTV 200 may include and/or represent resistive elements 104(1), 104(2), 104(3), 104(4), 104(5), 104(6), 104(7), and 104(8) incorporated on substrate 102. In some examples, resistive elements 104(1)-(8) may be arranged and/or configured in a linear pattern across the surface of substrate 102. In one example, resistive elements 104(1)-(8) may be spaced and/or positioned very close to one another to maximize the covered surface area of substrate 102 in an effort to spread the heat generated by resistive elements 104(1)-(8) across substrate 102.

As illustrated in FIG. 2, resistive elements 104(1)-(8) may collectively cover nearly the entire surface of one side of substrate 102. For example, resistive elements 104(1)-(N) may collectively cover approximately ninety percent or so of one side of substrate 102. Additionally or alternatively, resistive elements 104(1)-(N) may each stretch and/or extend all the way (or nearly so) from one side of substrate 102 to the other side of substrate 102. For example, resistive elements 104(1)-(N) may each stretch and/or extend across approximately ninety percent of the x-dimension and/or horizontal dimension of substrate 102 in FIG. 2.

Figure 3:
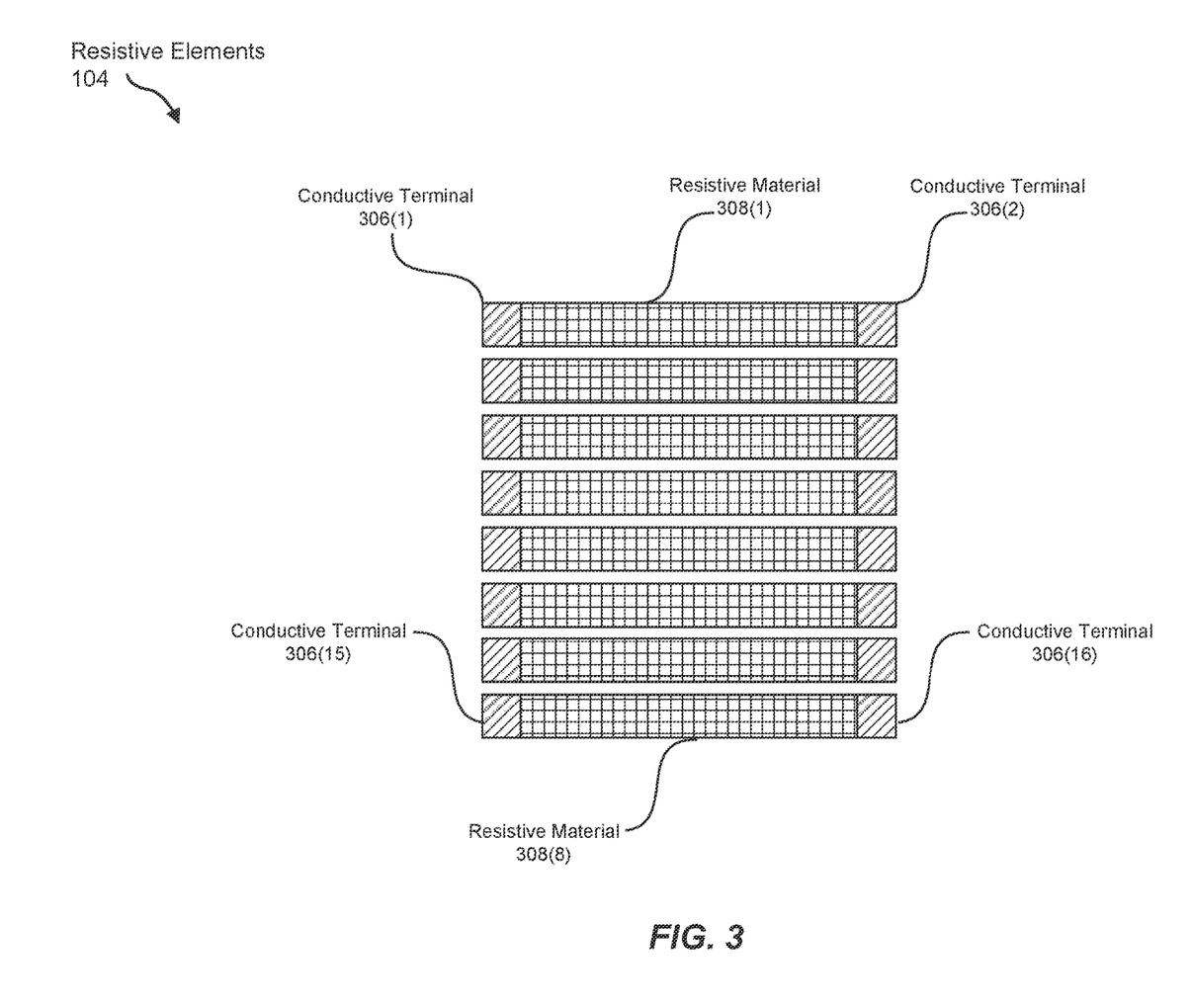
FIG. 3 is an illustration of exemplary resistive elements included and/or incorporated into a TTV in accordance with one or more embodiments of this disclosure.

FIG. 3 Illustrates exemplary resistive elements 104, each of which includes and/or represents resistive material deposited and/or applied between two conductive terminals. As illustrated in FIG. 3, resistive elements 104 in FIG. 3 may include and/or represent resistive material 308(1) deposited and/or applied between conductive terminals 306(1) and conductive terminal 306(2). In addition, resistive elements 104 in FIG. 3 may include and/or represent resistive material 308(8) deposited and/or applied between conductive terminals 306(15) and conductive terminal 306(16). Exemplary resistive elements 104 may also include and/or represent various other resistive materials and/or conductive terminals that are not explicitly labelled in FIG. 3.

In some examples, resistive material 308(1) and 308(8) may each include and/or represent resistive paste that is deposited, fired, and/or baked on substrate 102. In one example, the resistive paste may include and/or represent a mixture and/or compound of metal oxides (e.g., ruthenium, iridium, and rhenium oxides), conductive materials, binders, carriers, and/or glass.

In some examples, conductive terminals 306(1), 306(2), 306(15), and 306(16) may include and/or represent pads, traces, planes, and/or contacts composed of electrically conductive material. Examples of such electrically conductive material include, without limitation, copper, aluminum, silver, gold, alloys of one or more of the same, combinations or variations of one or more of the same, and/or any other suitable materials.

Figure 4:
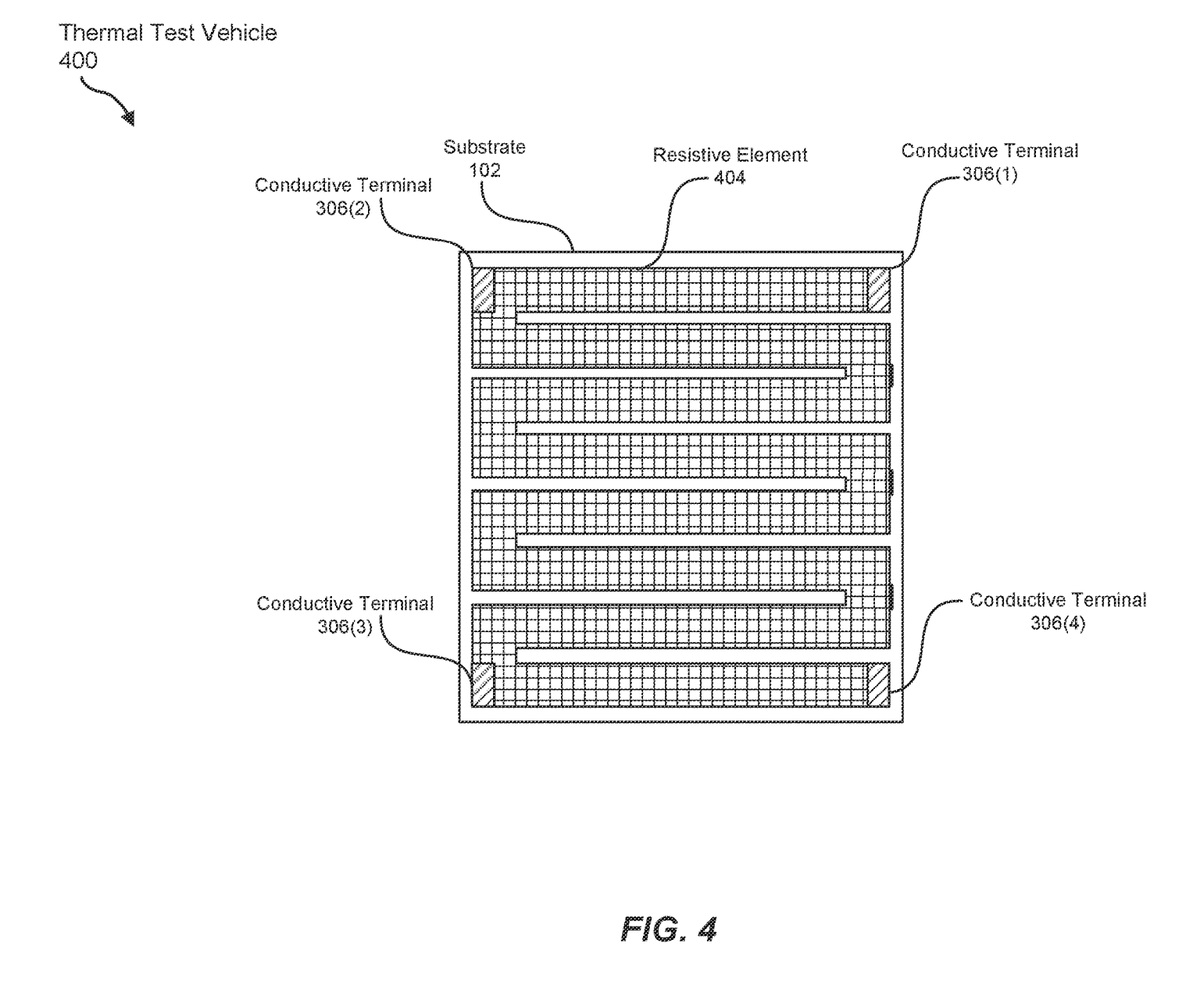
FIG. 4 is an illustration of an additional exemplary TTV for simulating and/or replicating the thermal characteristics of integrated circuits in accordance with one or more embodiments of this disclosure.

FIG. 4 illustrates an exemplary TTV 400 for simulating and/or replicating the thermal characteristics of integrated circuits. As illustrated in FIG. 4, exemplary TTV 400 may include and/or represent a resistive element 404 embedded on the surface of one side of substrate 102. In some examples, resistive element 404 may be deposited and/or applied in a square-wave pattern on the surface of substrate 102. In such examples, resistive element 404 may include and/or contain conductive terminals 306(1), 306(2), 306(3), and/or 306(4) positioned and/or placed proximate to the corners of substrate 102. Although resistive element 404 in FIG. 4 includes conductive terminals 306(1)-(4), resistive element 404 may include and/or contain only two conductive terminals positioned and/or placed at the ends of resistive element 404 atop substrate 102.

Figure 5:
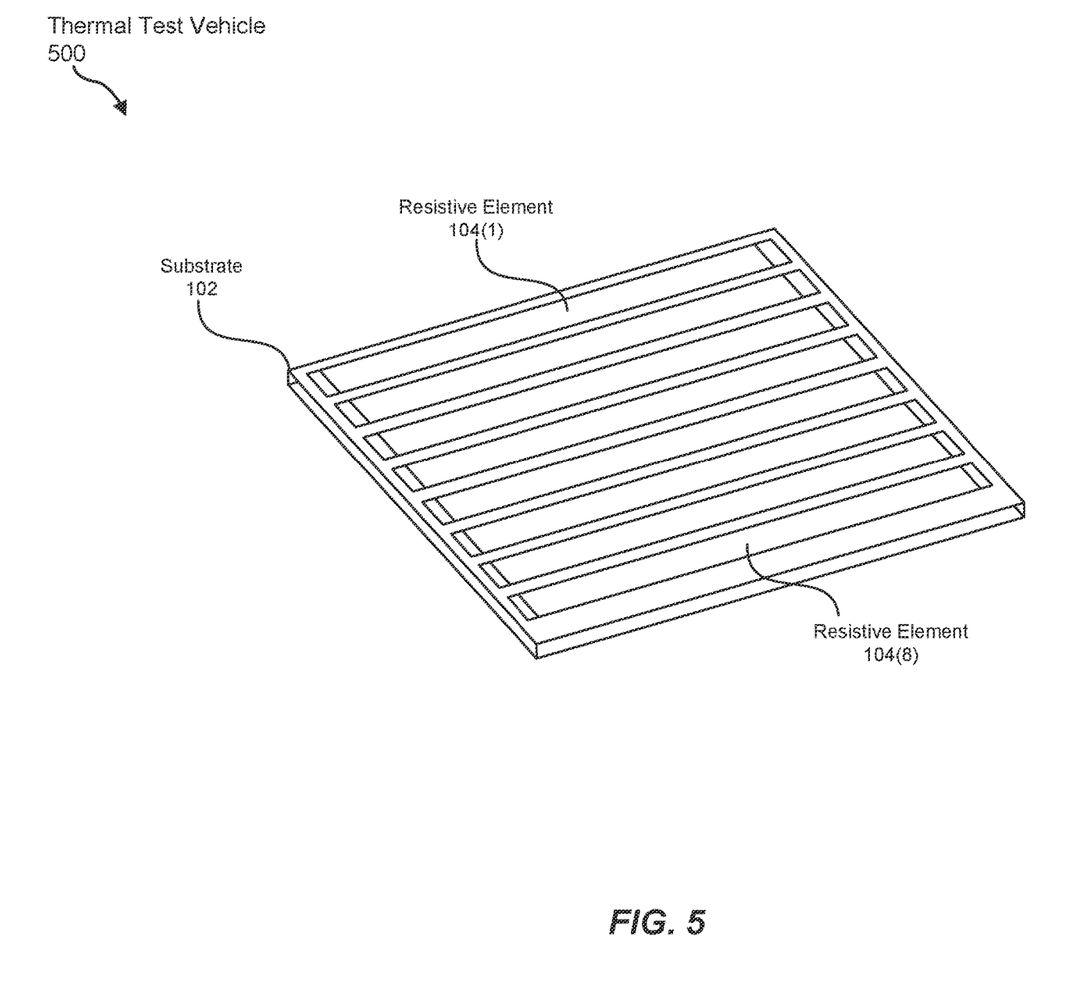
FIG. 5 is an illustration of an additional exemplary TTV for simulating and/or replicating the thermal characteristics of integrated circuits in accordance with one or more embodiments of this disclosure.

FIG. 5 illustrates a perspective view of an exemplary TTV 500 for simulating and/or replicating the thermal characteristics of integrated circuits. As illustrated in FIG. 5 and like TV 200 in FIG. 2, exemplary TTV 500 may include and/or represent resistive elements 104(1)-(8) incorporated on substrate 102. In some examples, resistive elements 104(1)-(8) may be arranged and/or configured in a linear pattern across the surface of substrate 102. In one example, resistive elements 104(1)-(8) may be spaced and/or positioned very close to one another to maximize and/or optimize the surface coverage of substrate 102 in an effort to spread the heat generated by resistive elements 104(1)-(8) across substrate 102.

Figure 6:
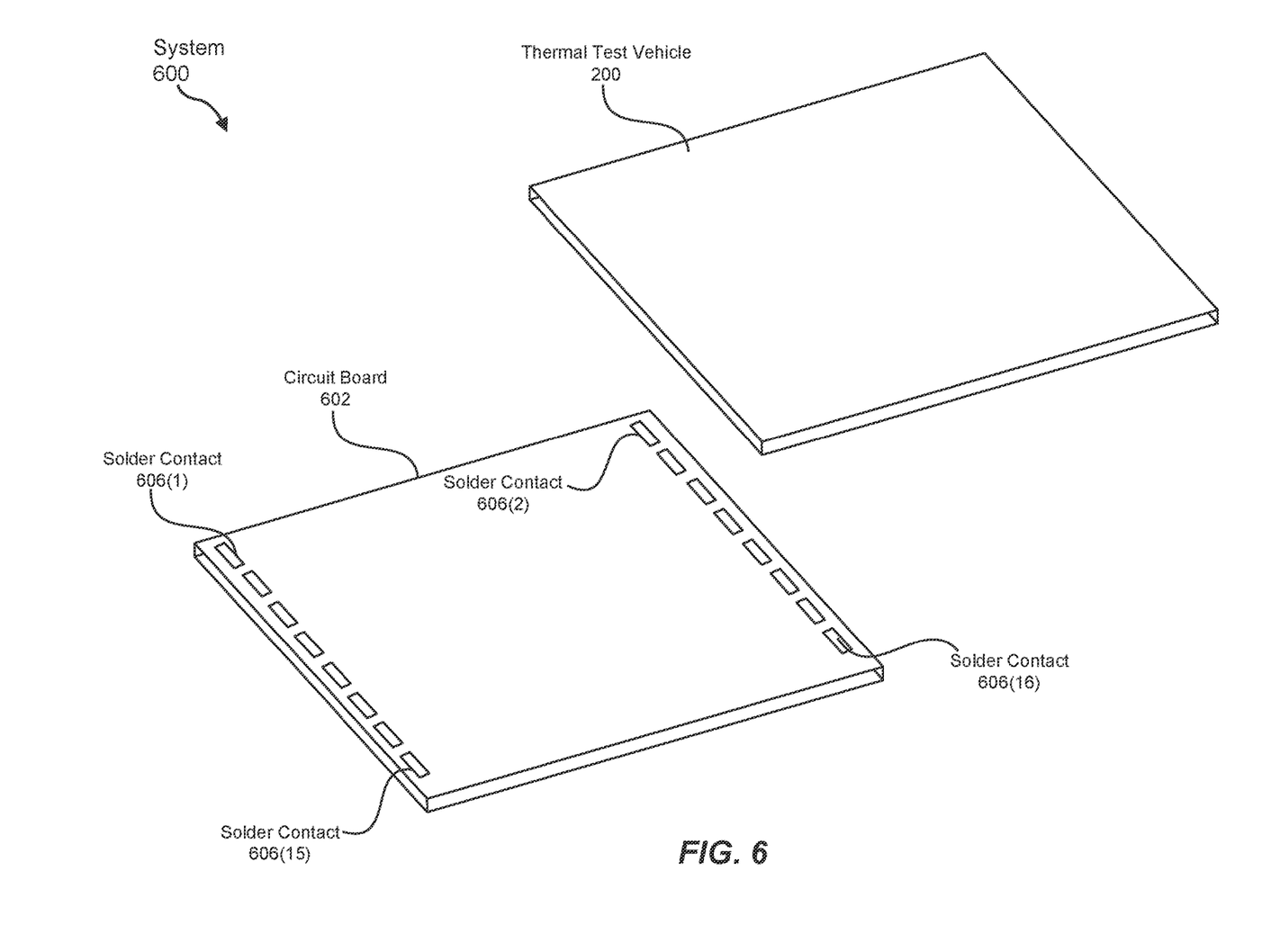
FIG. 6 is an illustration of an exemplary system for simulating and/or replicating the thermal characteristics of integrated circuits in accordance with one or more embodiments of this disclosure.

FIG. 6 illustrates an exemplary system 600 for simulating and/or replicating the thermal characteristics of integrated circuits. As illustrated in FIG. 6, exemplary system 600 may include and/or represent TTV 200 and a circuit board 602. In some examples, circuit board 602 may include and/or incorporate solder contacts 606(1), 606(2), 606(15), and/or 606(16) to which conductive terminals 306(1), 306(2), 306(15), and/or 306(16) of TTV 200 are mated and/or soldered. In one example, circuit board 602 may feed, deliver, and/or transfer electric current and/or power to the resistive elements of TTV 200 via the mating and/or soldering points between circuit board 602 and TTV 200. By doing so, circuit board 602 may facilitate and/or support heating the resistive elements to transfer heat to TTV 200 for testing and/or analysis purposes in connection with certain cooling and/or heat-mitigation solutions.

In some examples, solder contacts 606(1), 606(2), 606(15), and/or 606(16) may include and/or represent pads, traces, planes, and/or terminals composed of electrically conductive material. Examples of such electrically conductive material include, without limitation, copper, aluminum, silver, gold, alloys of one or more of the same, combinations or variations of one or more of the same, and/or any other suitable materials.

Figure 7:
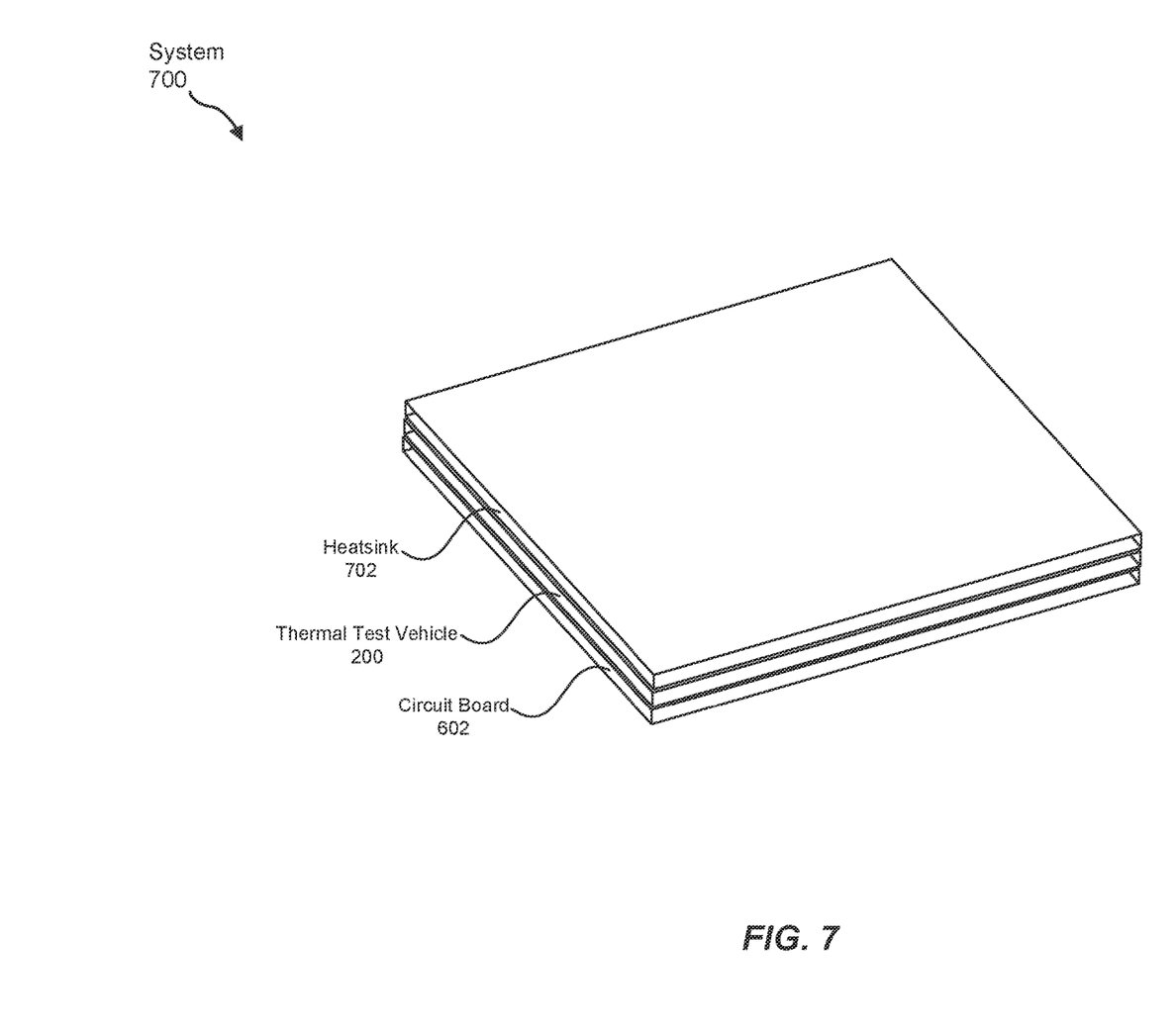
FIG. 7 is an illustration of an additional exemplary system for simulating and/or replicating the thermal characteristics of integrated circuits in accordance with one or more embodiments of this disclosure.

FIG. 7 illustrates an exemplary system 700 for simulating and/or replicating the thermal characteristics of integrated circuits. As illustrated in FIG. 7, exemplary system 700 may include and/or represent TTV 200, circuit board 602, and a heatsink 702. In some examples, the resistive elements of TTV 200 may be electrically coupled to circuit board 602. In such examples, the resistive elements of TTV 200 may draw electric current and/or power from circuit board 602, thereby heating the resistive elements.

In some examples, the substrate of TTV 200 may be thermally coupled to heatsink 702. In such examples, the substrate of TTV 200 may be in direct contact with heatsink 702, thereby facilitating and/or supporting the transfer of heat from TTV 200 to heatsink 702. In this system, TTV 200 may be able to properly simulate and/or replicate the thermal characteristics and/or output a specific integrated circuit (e.g., an ASIC incorporated in an upcoming release). As a result, a computing equipment manufacturer and/or vendor may perform thermal testing on heatsink 702 to determine whether or not the heatsink design will satisfy and/or support the cooling and/or heat-mitigation needs of the integrated circuit simulated by TTV 200 during operation.

Figure 8:
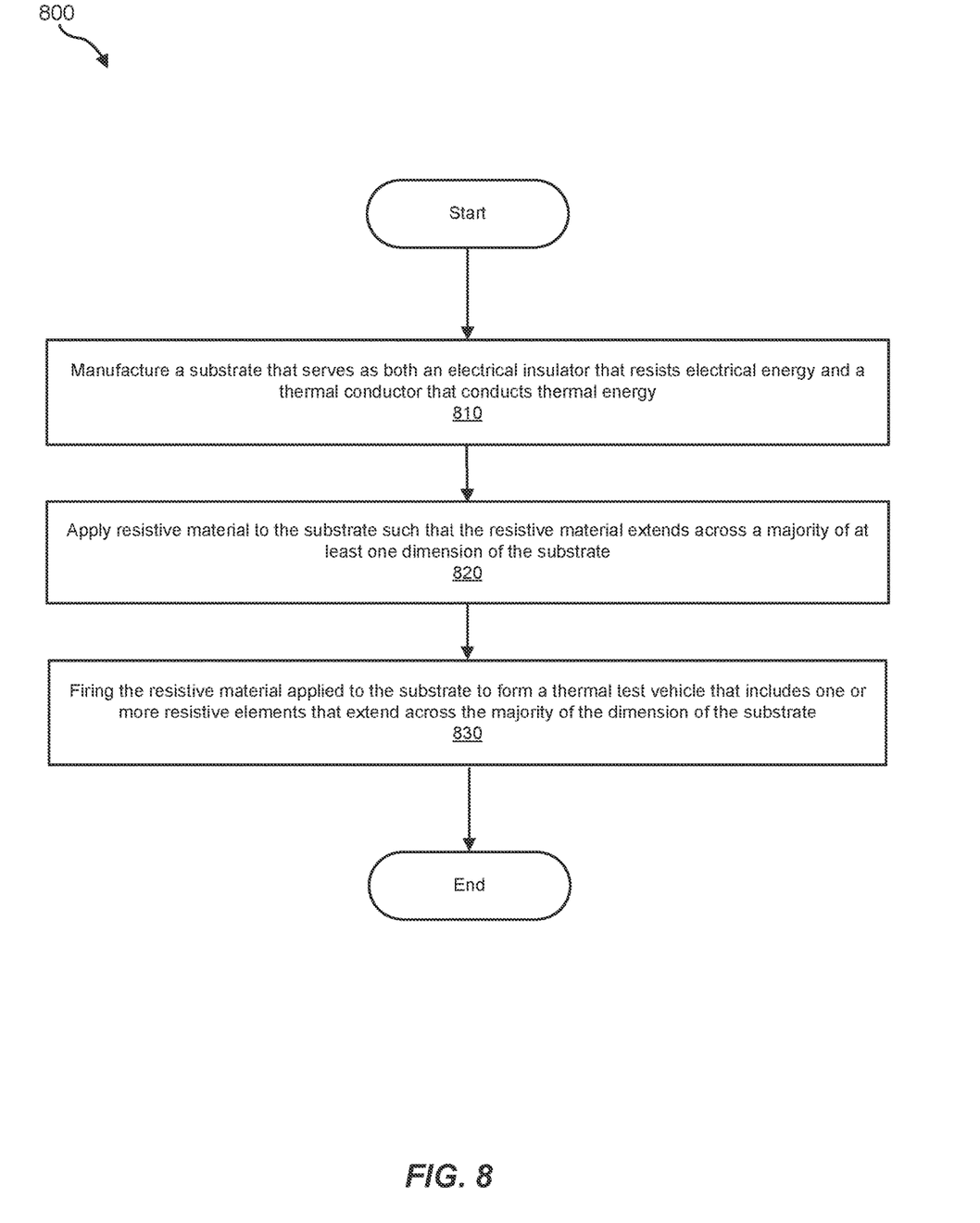
FIG. 8 is a flow diagram of an exemplary method for assembling and/or manufacturing hybrid circuit TTVs in accordance with one or more embodiments of this disclosure.

FIG. 8 is a flow diagram of an exemplary method 800 for assembling and/or manufacturing a hybrid circuit TTV for simulating and/or replicating the thermal characteristics of a certain integrated circuit. Method 800 may include the step of manufacturing a substrate that serves as both an electrical insulator that resists electrical energy and a thermal conductor that conducts thermal energy (810). Step 810 may be performed in a variety of ways, including any of those described above in connection with FIGS. 1-7. For example, a computing equipment manufacturer or subcontractor may manufacture a substrate that serves as both an electrical insulator that resists electrical energy (e.g., the flow of electric current) and a thermal conductor that conducts thermal energy (e.g., heat). In this example, the substrate may include and/or represent an alumina and/or boron nitrite base that exhibits qualities and/or characteristics of both electrical insulation and thermal conductivity.

Method 800 may also include the step of applying resistive material to the substrate such that the resistive material extends across a majority of at least one dimension of the substrate (820). Step 820 may be performed in a variety of ways, including any of those described above in connection with FIGS. 1-7. For example, the computing equipment manufacturer or subcontractor may apply resistive material to the substrate such that the resistive material extends across a majority of at least one dimension of the substrate. In this example, the resistive material may collectively cover the vast majority of one side of the substrate to facilitate a somewhat uniform heat distribution and/or transfer.

Method 800 may also include the step of firing the resistive material applied to the substrate to form a TTV that includes one or more resistive elements that extend across the majority of the dimension of the substrate (830). Step 830 may be performed in a variety of ways, including any of those described above in connection with FIGS. 1-7. For example, the computing equipment manufacturer or subcontractor may fire and/or bake the resistive material applied to the substrate to form a TTV that includes one or more resistive elements that extend across the majority of the dimension of the substrate. In this example, the firing and/or baking of the resistive material may occur and/or take place in an oven and/or furnace whose temperatures reach a certain threshold (e.g., 300 degrees Celsius or higher).

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A thermal test vehicle comprising:
   a substrate that serves as both:
      an electrical insulator that resists electrical energy; and
      a thermal conductor that conducts thermal energy; and
   one or more resistive elements disposed on an exposed surface of the substrate, wherein:
      the resistive elements extend across a majority of at least one dimension of the exposed surface of the substrate;
      the exposed surface of the substrate is coupled to a circuit board; and
      an additional exposed surface of the substrate is coupled to a heatsink that comprises metal.

2. The thermal test vehicle of claim 1, wherein the resistive elements each comprise a plurality of conductive terminals soldered to at least one electrical component that sources electric current to the resistive elements to produce heat.

3. The thermal test vehicle of claim 1, wherein the resistive elements comprise one or more thick film elements applied directly to the exposed surface of the substrate.

4. The thermal test vehicle of claim 3, wherein:
the thick film elements comprise resistive paste; and
the substrate comprises a ceramic base on which the resistive paste is fired.

5. The thermal test vehicle of claim 4, wherein the resistive paste is applied to the ceramic base such that a height of the resistive paste is uniform across all the resistive elements.

6. The thermal test vehicle of claim 1, wherein resistive elements collectively cover at least seventy-five percent of one side of the substrate.

7. The thermal test vehicle of claim 1, wherein the resistive elements each extend across at least ninety percent of the dimension of the exposed surface of the substrate.

8. The thermal test vehicle of claim 1, wherein the substrate comprises at least one of:
aluminum nitride;
alumina; and
boron nitride.

9. The thermal test vehicle of claim 1, wherein the resistive elements are disposed on the exposed surface of the substrate in a square-wave pattern.

10. The thermal test vehicle of claim 9, wherein:
the substrate comprises a plurality of corners; and
the resistive elements comprises a plurality of conductive terminals positioned proximate to the plurality of corners of the substrate, wherein the plurality of conductive terminals are soldered to at least one electrical component that sources electric current to the resistive elements to produce heat.

11. A system comprising:
a circuit board;
a thermal test vehicle that comprises:
  a substrate that serves as both:
    an electrical insulator that resists electrical energy; and
    a thermal conductor that conducts thermal energy; and
  one or more resistive elements disposed on an exposed surface of the substrate, wherein:
    the resistive elements extend across a majority of at least one dimension of the exposed surface of the substrate; and
    the exposed surface of the substrate is coupled to the circuit board:
at least one electrical component electrically coupled to the resistive elements of the thermal test vehicle, wherein the electrical component sources electric current to the resistive elements to produce heat; and
a heatsink that comprises metal and is coupled to an additional exposed surface of the substrate.

12. The system of claim 11, wherein the resistive elements each comprise a plurality of conductive terminals soldered to the electrical component that sources the electric current to the resistive elements.

13. The system of claim 11, wherein the resistive elements comprise one or more thick film elements applied directly to the exposed surface of the substrate.

14. The system of claim 13, wherein:
the thick film elements comprise resistive paste; and
the substrate comprises a ceramic base on which the resistive paste is fired.

15. The system of claim 14, wherein the resistive paste is applied to the ceramic base such that a height of the resistive paste is uniform across all the resistive elements.

16. The system of claim 11, wherein resistive elements collectively cover at least seventy-five percent of one side of the substrate.

17. The system of claim 11, wherein the resistive elements each extend across at least ninety percent of the dimension of the exposed surface of the substrate.

18. The system of claim 11, wherein the substrate comprises at least one of:
aluminum nitride;
alumina; and
boron nitride.

19. The system of claim 11, wherein the resistive elements are disposed on the exposed surface of the substrate in a square-wave pattern.

20. A method comprising:
manufacturing a substrate that serves as both:
  an electrical insulator that resists electrical energy; and
  a thermal conductor that conducts thermal energy;
applying resistive material to an exposed surface of the substrate such that the resistive material extends across a majority of at least one dimension of the exposed surface of the substrate;
firing the resistive material applied to the exposed surface of the substrate to form a thermal test vehicle that includes one or more resistive elements that extend across the majority of the dimension of the exposed surface of the substrate;
coupling the exposed surface of the substrate to a circuit board; and
coupling an additional exposed surface of the substrate to a heatsink.

* * * * *